(12) United States Patent
Park

(10) Patent No.: US 8,243,492 B2
(45) Date of Patent: Aug. 14, 2012

(54) ONE TIME PROGRAMMABLE MEMORY DEVICE AND MANUFACTURING METHOD OF ONE TIME PROGRAMMABLE MEMORY DEVICE

(75) Inventor: Sung-Kun Park, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 301 days.

(21) Appl. No.: 12/629,633

(22) Filed: Dec. 2, 2009

(65) Prior Publication Data

US 2010/0165700 A1 Jul. 1, 2010

(30) Foreign Application Priority Data

Dec. 30, 2008 (KR) .......................... 10-2008-0136447

(51) Int. Cl.
  *G11C 17/00* (2006.01)
  *H01L 21/70* (2006.01)

(52) U.S. Cl. ... 365/104; 365/94; 257/390; 257/E21.666; 257/E27.103

(58) Field of Classification Search ................... 365/104
See application file for complete search history.

(56) References Cited

U.S. PATENT DOCUMENTS

| | | | | |
|---|---|---|---|---|
| 5,554,869 A | * | 9/1996 | Chang | 257/316 |
| 5,672,529 A | * | 9/1997 | Kato et al. | 438/257 |
| 5,864,501 A | * | 1/1999 | Lee | 365/185.09 |
| 6,027,971 A | * | 2/2000 | Cho et al. | 438/257 |
| 6,346,725 B1 | * | 2/2002 | Ma et al. | 257/316 |
| 6,479,346 B1 | * | 11/2002 | Yi et al. | 438/257 |
| 6,720,579 B2 | * | 4/2004 | Shin et al. | 257/68 |
| 7,202,540 B2 | * | 4/2007 | Komori et al. | 257/408 |
| 7,435,647 B2 | * | 10/2008 | Kim | 438/257 |
| 8,014,204 B2 | * | 9/2011 | Torii | 365/185.18 |
| 2004/0161881 A1 | * | 8/2004 | Shin et al. | 438/128 |
| 2007/0010056 A1 | * | 1/2007 | Kim | 438/257 |
| 2007/0290192 A1 | * | 12/2007 | Rotondaro | 257/19 |

* cited by examiner

*Primary Examiner* — Son Mai

(74) *Attorney, Agent, or Firm* — Sherr & Vaughn, PLLC

(57) ABSTRACT

Embodiments relate to a manufacturing method of a one time programmable (OTP) memory device including: forming a common source in a linear configuration on a semiconductor substrate; forming a gate dielectric layer on the semiconductor substrate at both sides of the source; forming a gate over the gate dielectric layer; forming a spacer between the gates and at both side walls of the gate; and forming a drain on the semiconductor substrate at both sides of the spacer. With embodiments, the OTP memory device can be formed together with the logic part using the logic process and can increase the storage capacity of the OTP memory device by improving density of memory arrays.

17 Claims, 1 Drawing Sheet

ONE TIME PROGRAMMABLE MEMORY DEVICE AND MANUFACTURING METHOD OF ONE TIME PROGRAMMABLE MEMORY DEVICE

The present application claims priority under 35 U.S.C. 119 to Korean Patent Application No. 10-2008-0136447 (filed on Dec. 30, 2008), which is hereby incorporated by reference in its entirety.

BACKGROUND

A one time programmable (OTP) memory device can be programmed only one time, which significantly limits its usefulness as a general purpose memory. However, advantages of OTP memory devices can be useful in specific applications, such as a memory for tuning the numerical values of sensors such as image sensors, display driving circuits, and analog devices, a memory for an encryption code of a game pack and a game code, and a memory for programming a micro controller unit (MCU) code.

After being originally programmed, a programmable chip may not require a change in the program. When security and maintenance of data are more important, the OTP memory device can be utilized. The comparison of characteristics between the OTP memory device and other memory devices is as follows:

TABLE 1

|  | Flash memory device | ROM | OTP memory device |
| --- | --- | --- | --- |
| Merit | User codable Data changeable | Low-price Good code security | Low-price User codable (Original one time)). Good code security |
| Demerit | High-price Low code security | User uncodable Data unchangeable | Data unchangeable |

Considering the above, if a memory is CMOS process compatible, and memory capacity may be increased by improving the density of a unit device, the utility of the OTP memory device may be further improved.

SUMMARY

Embodiments relate to a one time programmable (OTP) memory device and a manufacturing method of the OTP memory device. Embodiments provide a one time programmable (OTP) memory device that can be formed with a logic part using a logic process such as a CMOS process. Memory capacity can be increased by improving density of memory arrays. Embodiments relate to a manufacturing method of the OTP memory device.

A one time programmable (OTP) memory device according to embodiments may include: a common source formed in a linear configuration on a semiconductor substrate; a gate dielectric layer formed over the semiconductor substrate at both sides of the source; a gate formed over the gate dielectric layer; a spacer formed between the gates and at both side walls of the gate; and a drain on the semiconductor substrate at both sides of the spacer.

A manufacturing method of a one time programmable (OTP) memory device according to embodiments may include: forming a common source in a linear configuration on a semiconductor substrate; forming a gate dielectric layer over the semiconductor substrate at both sides of the source; forming a gate over the gate dielectric layer; forming a spacer between the gates and at both side walls of the gate; and forming a drain on the semiconductor substrate at both sides of the spacer.

DRAWINGS

Figure 1:
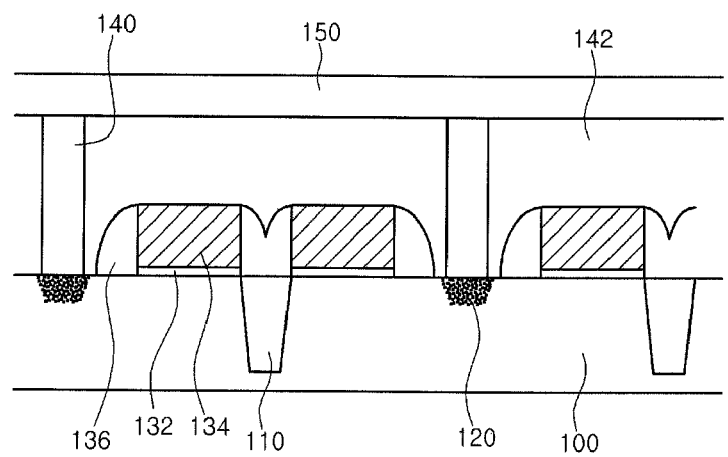

Example FIG. 1 is a schematic side cross-sectional view of constituents of a one time programmable (OTP) memory device according to embodiments.

Figure 2:
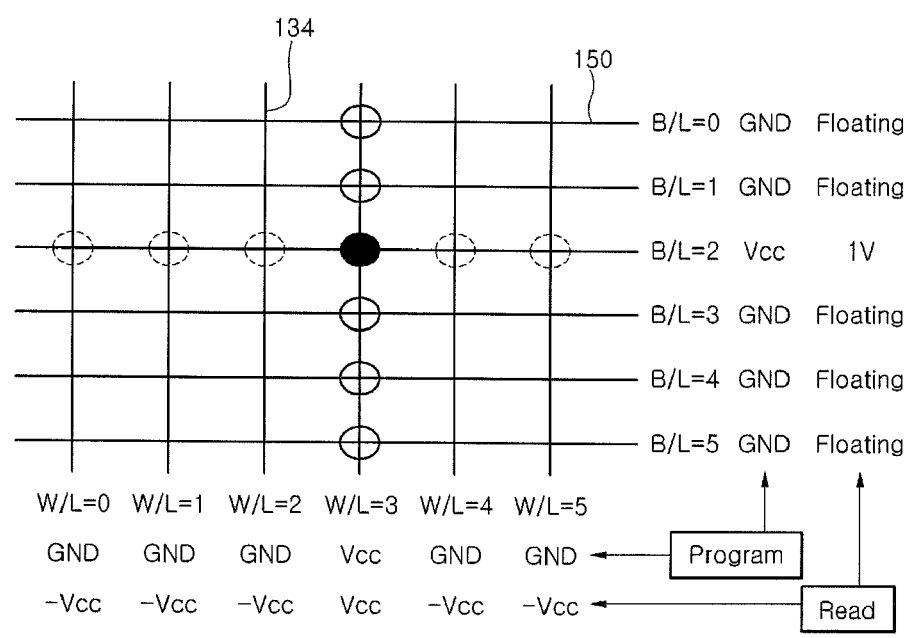

Example FIG. 2 is a schematic top view showing the constituents of the OTP memory device according to embodiments, and a manufacturing method of the OTP memory device.

DESCRIPTION

A one time programmable (OTP) memory device and a manufacturing method of the OTP memory device according to embodiments will be described in detail with reference to the accompanying drawings. Example FIG. 1 is a schematic side cross-sectional view of constituents of a one time programmable (OTP) memory device according to embodiments, and example FIG. 2 is a schematic top view showing the constituents of the OTP memory device according to embodiments and a manufacturing method of the OTP memory device.

Referring to example FIG. 1, the OTP memory device according to embodiments may include a source 110, a drain 120, a gate dielectric layer 132, a gate 134, a spacer 136, an insulation layer 142, a contact plug 140, and a metal wiring 150, formed over a semiconductor substrate 100. It is contemplated that the OTP memory device according to embodiments may be formed during a logic process.

A device isolation layer process may be performed during the logic process so that a device isolation layer may be formed on the semiconductor substrate 100. The device isolation layer process may be, for example, a shallow trench isolation (STI) process. Next, a field oxide inside the device isolation layer may be removed and an ion implantation process may be performed, thereby implanting ions into an active area under the STI.

Thereafter, the STI may be buried by a field oxide, a nitride layer, a polysilicon layer, etc. Therefore, the line-shaped source 110, having a linear configuration, with a self aligned source (SAS) structure, may be formed. The source 110 may be formed as a source line, having a memory common source (MCS) structure where ions are implanted into the semiconductor substrate rather than the SAS structure. In the case where the source 110 is formed with the MCS structure, it may have the same device characteristics as in the case where the source 110 is formed with the SAS structure, excepting that the size of a unit device array becomes large.

Thereafter, a gate dielectric layer 132 may be formed on both sides of the source 110. A gate 134 may be formed over the gate dielectric layer 132. A spacer 136 is formed over the area on the source 110 between the gates 134 and at both side walls of the gate 134. The spacer 136 may be formed of a nitride layer. Therefore, the source 110 functions as a common source.

After the spacer 136 is formed, an ion implantation process may be performed, thereby forming a drain 120 on the semiconductor substrate 110 at both sides of the spacer 136. Next, an insulation layer 142 may be formed over the semiconductor substrate 100 including the drain 120, the spacer 136, and the gate 134. A contact process and a metal wiring process may be performed on the insulation layer 142, thereby forming a contact plug 140 connected to the drain and a metal wiring 150 connected to the contact plug 140.

Therefore, the OTP memory device according to embodiments has a cell array structure as shown in example FIG. 2, wherein the gate 134 functions as a word line W/L and the metal line 150 functions as a bit line B/L.

Therefore, according to embodiments, the logic process is used as it is so that an OTP memory device having a large capacity can be implemented without an additional process. An annealing process is not required, so that the logic characteristics are never affected.

The operation and the driving method of the OTP memory device manufactured as described above will be described with reference to example FIGS. 1 and 2.

OPT Memory Device Operated in "Program" Mode (When Being Programmed)

TABLE 2

| Classification | Indication in FIG. 2 | Source 110 | Gate (Word Line; 134) | Drain (Bit Line; 120) |
|---|---|---|---|---|
| Programmed cell | Black circle | GND | Vcc | Vcc |
| Cell of word line 134 whose program is prevented | Solid line circle | GND | Vcc | GND |
| Cell of bit line 150 whose program is prevented | Dotted line circle | GND | GND | Vcc |

Vcc may be applied to the word line and the bit line of the cell to be programmed, and the word line and the bit line of other cells may be maintained at GND. At this time, the sources of all the cells may be maintained at GND. The program conditions as described above will be summarized in view of each cell, as shown in Table 2 above.

If voltage is applied as described above, a channel is formed under the gate 134 due to a hot carrier injection phenomenon and electrons are injected into the spacer 136 formed on the other side of the source 110. The corresponding cell may be recognized as being programmed by the electrons trapped by the spacer 136.

When OPT Memory Device is Operated in a "Read" Mode

TABLE 3

| Classification | Indication in FIG. 2 | Source 110 | Gate (Word Line; 134) | Drain (Bit Line; 120) |
|---|---|---|---|---|
| Programmed cell | Black circle | 0.5 V to 2 V | Vcc | Vcc |
| Cell of word line 134 whose program is prevented | Solid line circle | 0.5 V to 2 V | −Vcc | Floated |
| Cell of bit line 150 whose program is prevented | Dotted line circle | 0.5 V to 2 V | −Vcc | Floated |

The OTP memory device according to embodiments, to which a reverse read scheme is applied, may apply Vcc to the word line and bit line to be read and may maintain a negative potential voltage −Vcc on the word lines of other cells. Also, the OTP memory device allows the bit lines of other cells to be floated. At this time, voltage of about 0.5V to 2V, for example, voltage of 1V, may be applied to the source 110 of all cells.

The program conditions as described above summed up in view of each cell are shown in Table 3 above. If each cell is operated in a reverse mode with voltage applied as described above, electrons trapped in the spacer 137 cut channels so that current may not flow into only the programmed cell. Therefore, the cell into which current does not flowed is comprehended as being programmed, thereby making it possible to analyze data.

The OTP memory device according to embodiments as described above specifies the program/read conditions as described above, while using the logic process and applying the memory array structure, so that it can be operated as an absolutely different memory device.

With embodiments, the following effects may be obtained:

First, the one time programmable (OTP) memory device may be formed together with the logic part using a logic process such as CMOS. The storage capacity of the OTP memory device may be increased by improving the density of memory (unit device) arrays. Therefore, the utility of the OTP memory device can be improved in the field of user programmable OTP devices, and those requiring the maintenance and security of data.

Second, an OTP memory device with a large capacity may be implemented through a simple process by changing the transistor structure and adopting the self aligned source (SAS) structure, without changing the logic process. In this case, the effects of the annealing process can be excluded.

Third, the data program/read operations of the OTP memory device can be easily controlled by changing the transistor structure, and adopting the SAS structure.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a common source in a linear configuration on a semiconductor substrate;
   forming a gate dielectric layer on the semiconductor substrate at both sides of the source;
   forming a gate over the gate dielectric layer;
   forming a spacer between the gates and at both side walls of the gate; and
   forming a drain on the semiconductor substrate at both sides of the spacer, wherein the source is formed having a memory common source structure and the common source, the gate, and the drain form a one time programmable memory device.

2. The method of claim 1, wherein the source is formed having a self aligned source structure.

3. The method of claim 2, wherein the source is at least partially formed using a shallow trench isolation process of a logic process.

4. The method of claim 1, wherein the source is through an ion implantation process of a logic process.

5. The method of claim 1, including:
   forming an insulation layer over the semiconductor substrate including the drain, the spacer, and the gate.

6. The method of claim 5, including:
   forming a contact plug connected to the drain and a metal wiring connected to the contact plug over the insulation layer.

7. The method of claim 1, wherein the one time programmable memory device has a cell array structure where the gate functions as a word line and the metal wiring functions as a bit line.

8. An apparatus comprising:
a common source formed in a linear configuration on a semiconductor substrate;
a gate dielectric layer formed over the semiconductor substrate at both sides of the source;
a gate formed over the gate dielectric layer;
a spacer formed between the gates and at both side walls of the gate; and
a drain on the semiconductor substrate at both sides of the spacer, wherein the common source, gate, and drain form a one time programmable memory device.

9. The apparatus of claim 8, wherein the source has a self aligned source structure.

10. The apparatus of claim 8, wherein the source is formed having a memory common source structure.

11. The apparatus of claim 8, including:
an insulation layer formed over the semiconductor substrate including the drain, the spacer, and the gate.

12. The apparatus of claim 11, including:
a contact plug formed over the insulation layer and connected to the drain; and
a metal wiring formed over the insulation layer and connected to the contact plug.

13. The apparatus of claim 8, wherein the one time programmable memory device has a cell array structure where the gate functions as a word line and the metal wiring functions as a bit line.

14. The apparatus of claim 13, wherein the one time programmable memory device has a program mode where Vcc is applied to the gate and drain of a cell to be programmed, and GND is maintained in the gate and in the drain of other cells.

15. The apparatus of claim 14, wherein GND is maintained in the sources of all cells.

16. The apparatus of claim 8, wherein the one time programmable memory device has a read mode where Vcc is applied to the gate and drain of a cell to be read, a negative potential voltage is applied to the gates of other cells, and the drains of other cells are floated.

17. The apparatus of claim 16, wherein voltage of 0.5 V to 2 V is applied to the sources of all cells.

* * * * *